United States Patent
Hu et al.

(10) Patent No.: US 8,024,157 B2
(45) Date of Patent: Sep. 20, 2011

(54) DEVICE FOR DETECTING VOLTAGE DISTURBANCE

(75) Inventors: Fei Huang Hu, Shanghai (CN); Jian Duo Li, Shanghai (CN); Guang Qiang Tang, Shanghai (CN); Ting Xie, Shanghai (CN); Yi Gang Yu, Shanghai (CN); Yue Zhuo, Beijing (CN)

(73) Assignee: Siemens Aktiengesellschaft, Munich (DE)

( * ) Notice: Subject to any disclaimer, the term of this patent is extended or adjusted under 35 U.S.C. 154(b) by 451 days.

(21) Appl. No.: 12/289,394

(22) Filed: Oct. 27, 2008

(65) Prior Publication Data

US 2009/0179631 A1    Jul. 16, 2009

(30) Foreign Application Priority Data

Oct. 29, 2007 (CN) .......................... 2007 1 0184923

(51) Int. Cl.
 *H04B 15/00* (2006.01)
 *G01R 19/165* (2006.01)
 *G01R 13/00* (2006.01)
 *H03F 1/26* (2006.01)
(52) U.S. Cl. ............. 702/193; 702/64; 702/66; 702/189
(58) Field of Classification Search ............. 702/57–61, 702/64–71, 73, 74, 80–82, 189–193, 195; 324/500, 512, 522, 537, 76.39; 361/78, 79, 361/86, 90, 91.2
See application file for complete search history.

(56) References Cited

U.S. PATENT DOCUMENTS

| | | | | |
|---|---|---|---|---|
| 4,583,553 A | * | 4/1986 | Shah et al. | 600/517 |
| 5,229,651 A | * | 7/1993 | Baxter et al. | 307/66 |
| 5,943,246 A | * | 8/1999 | Porter | 700/293 |
| 6,005,759 A | * | 12/1999 | Hart et al. | 361/66 |
| 6,510,014 B2 | * | 1/2003 | Kikuta et al. | 360/60 |
| 6,675,071 B1 | * | 1/2004 | Griffin et al. | 700/286 |
| 6,950,764 B2 | * | 9/2005 | Ennis et al. | 702/60 |
| 7,649,347 B2 | * | 1/2010 | Bickel | 324/100 |

* cited by examiner

*Primary Examiner* — Michael P Nghiem
*Assistant Examiner* — Ricky Ngon
(74) *Attorney, Agent, or Firm* — Harness, Dickey & Pierce, P.L.C.

(57) ABSTRACT

At least one embodiment of the present invention provides a method for detecting voltage disturbance. In at least one embodiment the method includes storing the digitized point values of a voltage reference waveform; detecting actual voltage values, and converting the actual voltage values by digitization into point values of the actual voltage which are in one-to-one correspondence with the point values of the reference waveform; comparing the point values of the actual voltage with the corresponding point values of the reference waveform; judging that a voltage disturbance occurs if, for N successive points, the differences between the point values of the actual voltage and the corresponding point values of the reference waveform are all greater than a predetermined disturbance threshold, wherein N is an integer greater than 0. A technical solution of the present invention improves the response speed of the detection, and shortens the response time.

16 Claims, 9 Drawing Sheets

DEVICE FOR DETECTING VOLTAGE DISTURBANCE

PRIORITY STATEMENT

The present application hereby claims priority under 35 U.S.C. §119 on Chinese patent application number CN 200710184923.7 filed Oct. 29, 2007, the entire contents of which is hereby incorporated herein by reference.

FIELD

Embodiments of the present invention generally relate to a method for detecting voltage disturbance and/or to a device for implementing the method. In at least one embodiment, the present invention more specifically relates to a method for detecting voltage disturbance in electric power measurement equipment such as power monitoring devices (PMD) or advanced electric meters and/or a device for implementing the method.

BACKGROUND

In recent years, since the quality of electric energy is capable of causing substantial economical impacts on industrial users, the issues concerning the quality of electric energy have attracted more and more attention, and the voltage disturbances at the power supply side, such as temporary-drop, surge, imbalance, etc. are considered as the most destructive ones among various problems of the quality of electric energy. Along with the increased use of power sensitive electric equipment in control processes and in automation processes, the voltage disturbances have caused destruction to industrial processes and have brought about substantial economic losses to users. Because it is necessary to further reduce voltage disturbances, great attention has been paid to finding a method for detecting and recording voltage disturbance waveform.

Currently, various types of electric energy detection equipment such as power monitoring devices (PMD) and advanced electric meters, etc. are broadly used in industry. In recent years, as the attention to the voltage disturbance has increased, users have made a demand on electric energy detection equipment: that is, it is desirable for it to have the capability of effectively detecting the voltage disturbance, furthermore, it is desirable to have the function of waveform capture so as to aid the users to analyze easily the root causes of the voltage disturbance and to make a corresponding strategy for controlling them. In view of the limited internal resources of electric energy detection equipment, especially of a PMD, the detection response time needs to be comparatively fast, while the response time of an existing detection methods based on voltage virtual value is slow, therefore, it is desirable to propose a new method which is capable of meeting the aforementioned requirements and to be realized easily in electric energy detection equipment.

SUMMARY

At least one embodiment of the present invention provides a new method and/or device for detecting voltage disturbance in electric energy detection equipment, so as to meet user requirements of ease of realization and high efficiency.

According to one aspect of at least one embodiment of the present invention, a method is provided for detecting voltage disturbance, comprising: storing the digitized point values of a voltage reference waveform; detecting the actual voltage values, and converting said actual voltage values by digitization into the point values of the actual voltage which are in one-to-one correspondence with said point values of the reference waveform; comparing said point values of the actual voltage with said corresponding point values of the reference waveform; judging that a voltage disturbance occurs if, for N successive points, the differences between said point values of the actual voltage and said: point values of the reference waveform are all greater than a predetermined disturbance threshold, wherein N is an integer greater than 0. Preferably, said point values of the reference waveform are obtained by digitizing successively a standard voltage waveform with a fixed time interval. The value of the fixed time interval is preferably assumed to be from 10 microseconds to 2000 microseconds. The N is preferably from 3 to 5. The disturbance threshold is the product of the point values of the reference waveform and a predetermined percentage.

In practical industrial applications, due to the existence of a large number of power electronic devices and nonlinear loads, the distortion in voltage waveform has become very serious. Therefore, at least one embodiment of the present invention also provides correspondingly a further solution of a method for detecting voltage disturbance, i.e. when a reference waveform update condition is satisfied; the point values of voltage reference waveform are updated according to an updating algorithm. Wherein, the reference waveform update condition is that: a detected positive peak value of the actual voltage waveform is greater than a predetermined positive peak threshold and a negative peak value thereof is less than a predetermined negative peak threshold, and the differences between the values of the actual voltage and the corresponding point values of the reference waveform are greater than a predetermined distortion threshold. Preferably, the reference waveform updating condition further comprises that: the differences between the values of the actual voltage and the corresponding point values of the reference waveform are less than or equal to a predetermined disturbance threshold. The update algorithm is as follows:

$$R_{(m,n)} = R_{(m-1,n)} + [S_{(m,n)} - R_{(m-1,n)}] * K \quad (1)$$

wherein, R represents the point values of the reference waveform, S represents the point values of the actual voltage, m represents the mth updating and m>=1, n represents the nth point, and K is the update coefficient for determining the updating speed.

In addition, when it is judged that a voltage disturbance has occurred, it is also possible to record the point values of the actual voltage until the voltage returns to its normal level and is maintained for a predetermined length of time, so as to determine that the voltage disturbance actually happened. In this case, the predetermined length of time is one cycle of the voltage waveform. Preferably, it is possible to store successively the point values of the actual voltage in a circulating buffer memory according to a first in first out (FIFO) rule, and the circulating buffer memory is locked when it is judged that a voltage disturbance has occurred, so as to analyze the data prior to the occurrence of the disturbance.

A device for detecting voltage disturbance for implementing the method of at least one embodiment of the present invention comprises: a reference waveform storage unit, for storing the digitized point values of a reference waveform; a voltage detection unit, for detecting the actual voltage values, and for converting said actual voltage values by digitization into the point values of the actual voltage which are in one-to-one correspondence with said point values of the reference waveform; a point value comparison unit, for comparing the point values of the actual voltage obtained from said voltage detection unit with the corresponding point values of the reference waveform from said reference waveform storage unit; and a disturbance judgment unit, for obtaining the comparison results of the point value comparison unit, and judging that a voltage disturbance has occurred if, for N successive points, the differences between the point values of the actual voltage and said corresponding point values of the reference waveform are all greater than a predetermined disturbance threshold, wherein N is an integer greater than 0.

In order to adapt the reference voltage waveform to the distortion in the waveform of power supply voltage, the device for detecting voltage disturbance of at least one embodiment of the present invention further comprises: an updating judgment unit, for comparing the positive and negative peak values of the actual voltage obtained from the voltage detection unit respectively with the predetermined positive and negative peak thresholds, and comparing the comparison results obtained from the point value comparison unit with a predetermined distortion threshold, so as to notify a reference waveform updating unit to update the point values of the reference waveform when the comparison results meet a reference waveform updating condition; and a reference waveform updating unit, for updating the point values of the reference waveform according to an updating algorithm when the updating has been received from the updating judgment unit.

The device for detecting voltage disturbance of at least one embodiment of the present invention further comprises a waveform recording unit, for recording the point values of the actual voltage detected by the voltage detection unit when the disturbance judgment unit judges that a voltage disturbance has occurred. As an alternative solution, it can further comprise a circulating buffer memory, for storing successively the point values of the actual voltage detected by the voltage detection unit according to a first in first out (FIFO) rule, and locking the circulating buffer memory when the disturbance judgment unit judges that a voltage disturbance has occurred.

Since the method for detecting voltage disturbance and the device thereof according to at least one embodiment of the present invention use the scheme of comparing actual voltage values with corresponding point values of reference waveform in a point-to-point manner, the judging process of voltage disturbance is simplified. One half of a frequency current (10 ms) is needed by the current disturbance detection technology based on voltage virtual value to detect a disturbance, while the technical scheme of the present invention can detect a disturbance within 1 ms, which improves greatly the response speed of the detection, shortens the response time, is capable of being adapted to the requirements of fast voltage disturbance detection, and is suitable for being applied in electric energy detection equipment such as power monitoring devices (PMD) and advanced electric meters.

Figure 1:
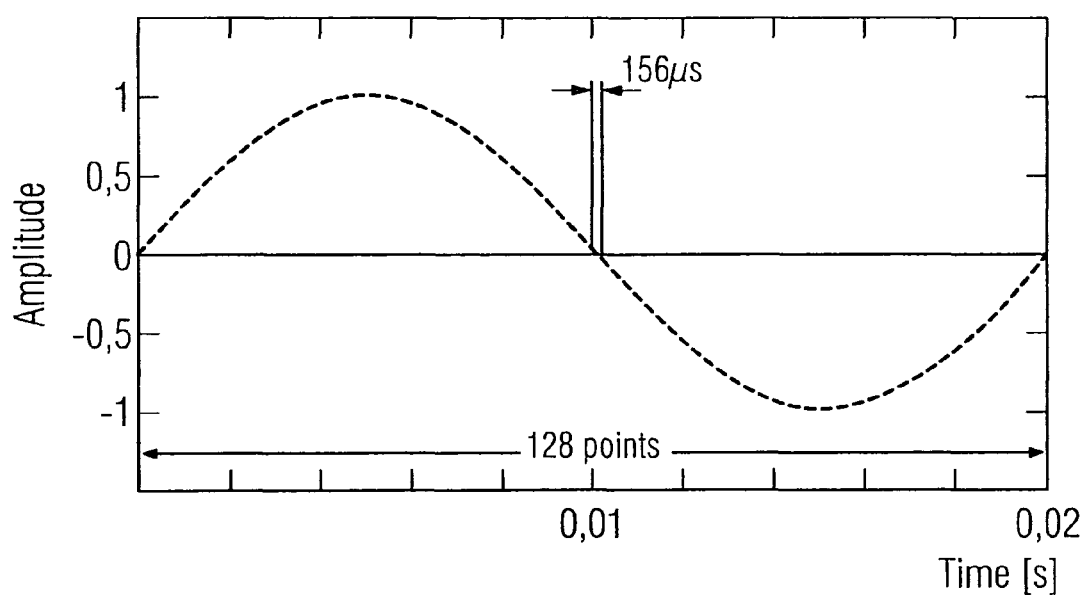
FIG. 1 shows a reference waveform according to an embodiment of the present invention.

The specific embodiments of the present invention will be described hereinbelow by referring to the accompanying drawings; in the drawings reference symbols that are the same have the same meanings.

DETAILED DESCRIPTION OF THE EXAMPLE EMBODIMENTS

Various example embodiments will now be described more fully with reference to the accompanying drawings in which only some example embodiments are shown. Specific structural and functional details disclosed herein are merely representative for purposes of describing example embodiments. The present invention, however, may be embodied in many alternate forms and should not be construed as limited to only the example embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the present invention to the particular forms disclosed. On the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," "and" "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

First of all, the point values of voltage reference waveform are stored in the device for detecting voltage disturbance in a PMD of this embodiment, the points values of reference waveform can be of a series of point values obtained through digitizing successively a standard voltage waveform with fixed time intervals, and the point values of the reference waveform can be stored in a reference table. The time interval depends upon the sampling frequency of analog to digit (A/D) conversion. Generally, the value of the fixed time interval is between 10 microseconds and 2000 microseconds, 156 μs is suggested to be a time interval in this embodiment, thus, for a 50 Hz power supply system, during one cycle (1 s/50)/(156 μs)=128 digitized points will be stored in the reference waveform storing unit, and this example is shown in FIG. 1.

In an operating mode, the device for detecting voltage disturbance in the PMD will obtain successively the actual voltage values from the power supply end, and execute A/D conversion to the actual voltage values, so as to transform the actual voltage values into digitized point values of one-to-one correspondence to the point values of the reference waveform. Then, the device for detecting voltage disturbance compares the actual voltage point values and their corresponding reference waveform point values in a point-to-point manner, and for N continuous points, if the differences between their actual voltage point values and the corresponding point values of reference waveform are all greater than a predetermined disturbance threshold, the device for detecting voltage disturbance judges that a voltage disturbance has occurred. Wherein, the disturbance threshold can be for example 5% of the reference voltage point values, N can be an integer greater than zero, and generally, the greater the number of chosen points is the longer the time for detecting the disturbance, the number of points is recommended to be 3-5. This can also be understood as that, during a continuous time period, if the differences between the actual voltage point values and the corresponding point values of the reference waveform all exceed the predetermined disturbance threshold, the device for detecting voltage disturbance judges that a voltage disturbance has occurred. The comparison in the point-to-point manner described in the present invention means the comparison between a digitized point in the actual voltage waveform and a corresponding point in the reference waveform. In addition, when it is judged that a voltage disturbance has occurred, the device for detecting voltage disturbance can further trigger a recording signal to record the point values of the actual voltage waveform for subsequent further analysis. Of course, it is also advantageous to store the data prior to the occurrence of the disturbance so as to conduct the subsequent analysis. This can be realized by setting a circulating buffer memory, which circulating buffer memory stores successively actual voltage point values according to a first in first out (FIFO) rule. Once the recording signal is triggered, the buffer memory is locked, and the device for detecting voltage disturbance will read data from the circulating buffer memory in order to obtain the complete waveform.

The disturbance threshold mentioned above can be adjusted according to a user's actual situation, that is to say, it can be a value different from 5%. In addition, in order to prevent detection errors due to micro voltage disturbance during the A/D conversion or sampling errors, the verification of 3-5 continuous points is advantageous.

When the differences between the compared point values are less than for example 10% of the reference voltage point values, the voltage of the power supply can be regarded as being capable of returning to its normal level. However, the waveform recording unit does not stop the waveform recording immediately. It stops recording only in the case that the above-mentioned differences are within the normal range for a continuous time period, for example, a time period of 128 points (one cycle).

Figure 2:
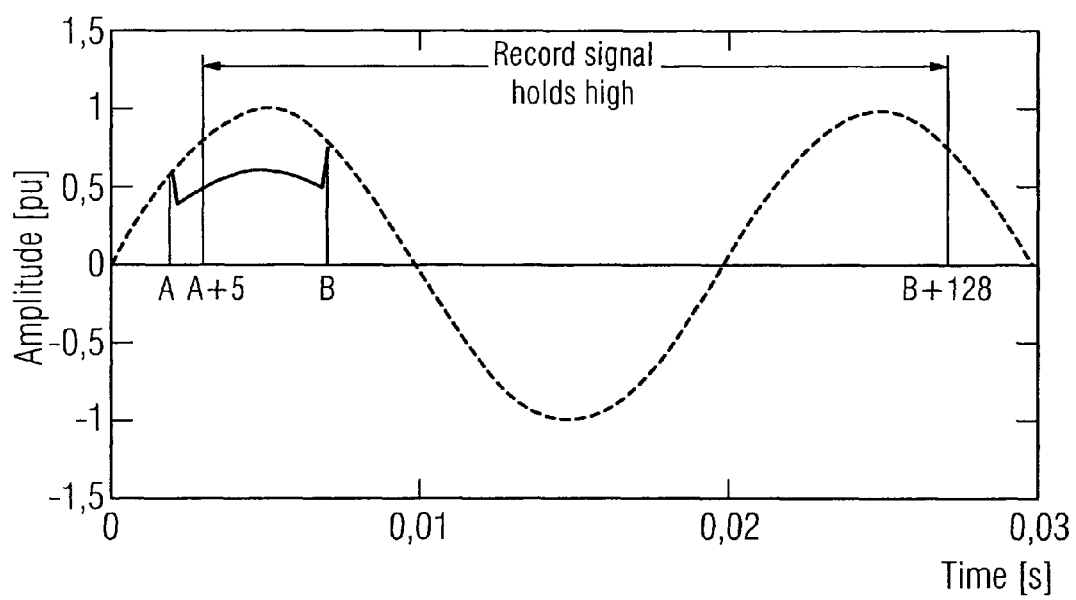
FIG. 2 is a schematic view of the voltage disturbance detection based on the point-to-point detection method according to an embodiment of the present invention.

The recording and processing of a complete waveform are represented by the voltage flickering detection as illustrated in FIG. 2: the dash line corresponds to the reference waveform while the solid line is the waveform of an input power supply. As seen from point A, since the difference between the voltage point value of the power supply and the reference waveform point value is greater than 5%, it is possible that a voltage disturbance has occurred. When the situation that the difference is greater than 5% keeps on for more than 5 points, it is judged that a voltage disturbance has occurred, and a recording signal is triggered to start waveform capturing. It can be seen in FIG. 2 that, only after point "A+5", the recording signal is triggered to be high (for example, being set as 1). At point B, the voltage of power supply returns to its normal level, but the device for detecting voltage disturbance will go on recording an additional 128 points till point "B+128", at which time the waveform capturing is stopped.

Figure 3:
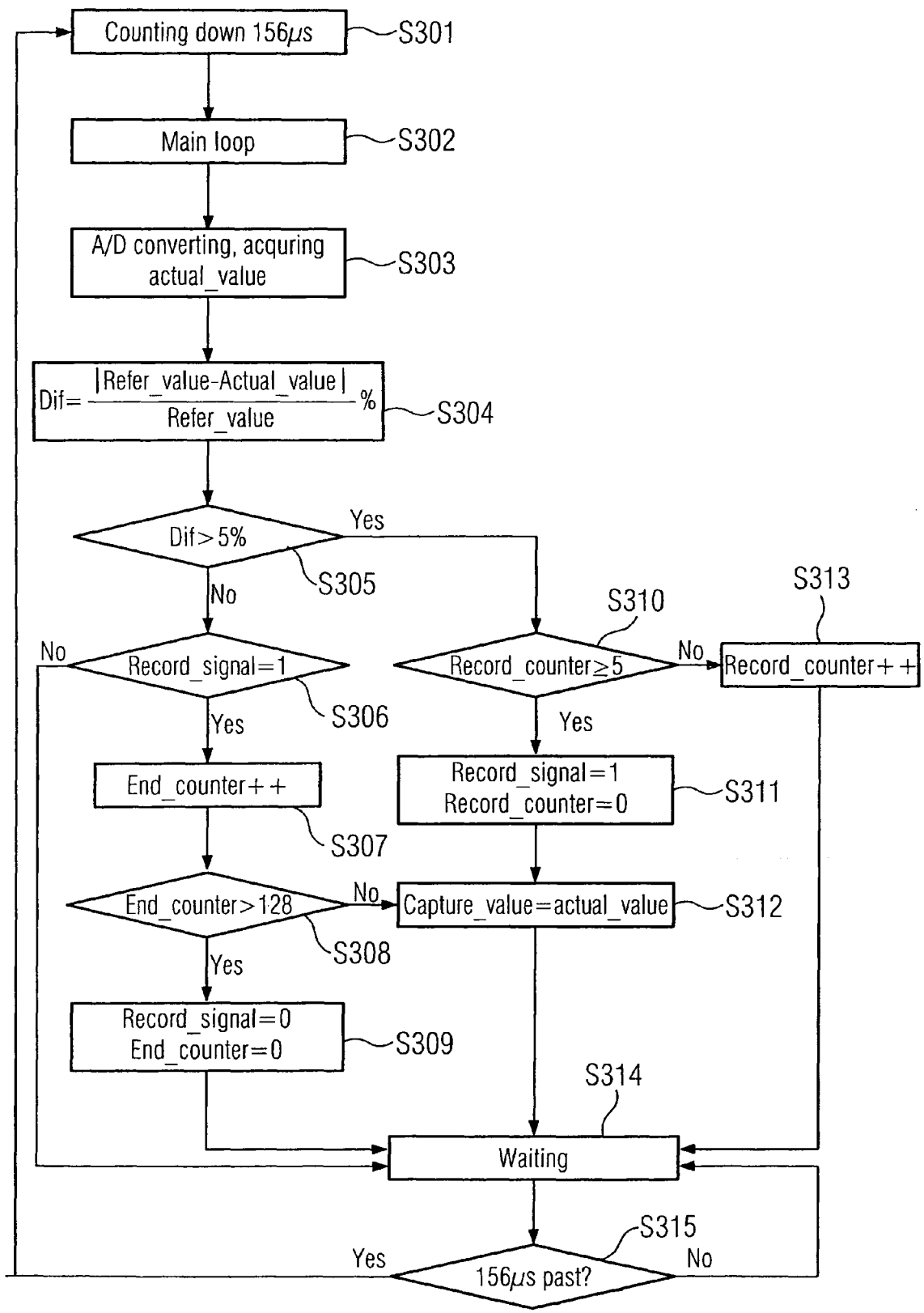
FIG. 3 shows a flow chart of the point-to-point voltage disturbance detection according to a first embodiment of the present invention.

The flow chart of the point-to-point method for detecting voltage disturbance will be described hereinbelow by referring to FIG. 3. In FIG. 3, Dif represents the difference ratio between a reference waveform point value and an actual voltage point value. Record_signal is a flag, for judging whether a disturbance is detected and to start capturing. Record_counter is a counter, for counting 5 continuous points before the waveform recording. End_counter is a counter too, for continuing counting 128 points after the voltage disturbance has disappeared. Capture_value is a data set, for storing the recorded waveform values.

At step S301, the device for detecting voltage disturbance counts down for a predetermined time, for example 156 μs; at step S302, the device for detecting voltage disturbance begins entering a main loop; at step S303, actual voltage values are obtained and A/D conversion is carried out to convert the actual voltage value into digitized point values actual_value; at step S304, the device for detecting voltage disturbance calculates the difference ratio Dif of the reference waveform point values to the digitized actual voltage point values actual_value; and at step S305, the device for detecting voltage disturbance judges whether Dif is greater than 5%.

If at step S305, the device for detecting voltage disturbance judges that Dif is greater than 5%, it is possible that a voltage disturbance has occurred; the device for detecting voltage disturbance further judges at step S310 whether Record_counter is greater than 5, if Record_counter is less than 5, it means that the disturbance has not yet lasted for the predetermined time (i.e. the length of time of 5 points), then at step S313 the device for detecting voltage disturbance increases Record_counter, and at steps S314 and S315 the device for detecting voltage disturbance waits for the arrival of a time interval of 156 μs and enters the next loop. If Record_counter is judged as being greater than or equal to 5 at step S310, that is the disturbance has already lasted for the length of time of 5 points, the device for detecting voltage disturbance resets the Record_counter at step S311 and triggers a recording signal Record_signal so as to start capturing the actual voltage values, i.e. recording Capture_value=actual_value; at steps S314 and S315, the device for detecting voltage disturbance keeps waiting until the end of the 156 μs time interval. In the next 156 μs counting down loop, the device for detecting voltage disturbance obtains new actual voltage values and calculates the Dif, if at step S305 the device for detecting voltage disturbance judges that the Dif is still greater than 5%, i.e., the voltage disturbance still exists, the device for detecting voltage disturbance continues capturing the actual voltage values, and enters the next loop.

If at step S305 the device for detecting voltage disturbance judges that the Dif is less than 5%, i.e., the actual voltage value is indicated to be within a normal range or has returned from the case of disturbance to the normal range, the device for detecting voltage disturbance judges at step S306 whether the Record_signal is equal to 1, if Record_signal=1, i.e., it is indicated that the actual voltage has returned from the case of disturbance to the normal range, the device for detecting voltage disturbance starts increasing End_counter at step S307, and judges at step S308 whether End_counter is greater than 128, so as to count a delay of 128 points after the voltage disturbance has disappeared, if End_counter is greater than 128, i.e., the delay of 128 points has already been counted after the disappearance of the voltage disturbance, at step S309 the device for detecting voltage disturbance sets Record_signal and End_counter to 0, so that the actual voltage value is no longer recorded; if End_counter is less than or equal to 128 the program progresses to step S312, and the device for detecting voltage disturbance records successively the corresponding actual voltage values.

The flowchart of the point-to-point method for detecting voltage disturbance of an embodiment of the present invention has been described in detail above according to FIG. 3.

Figure 4:
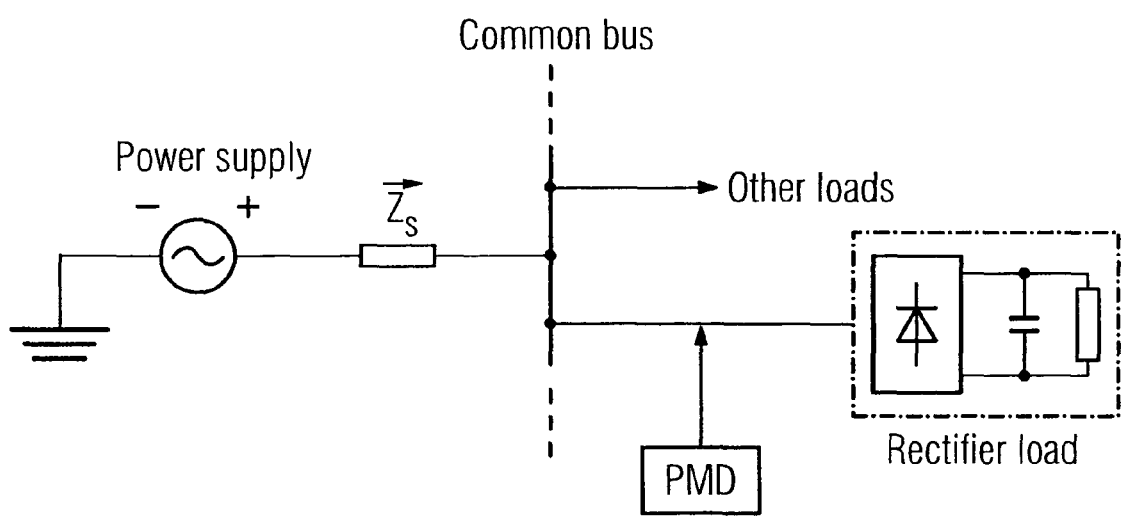
FIG. 4 shows a circuit connection diagram of the voltage disturbance detection, in which a nonlinear load (rectifier) is connected, according to a second embodiment of the present invention.
Figure 5A:
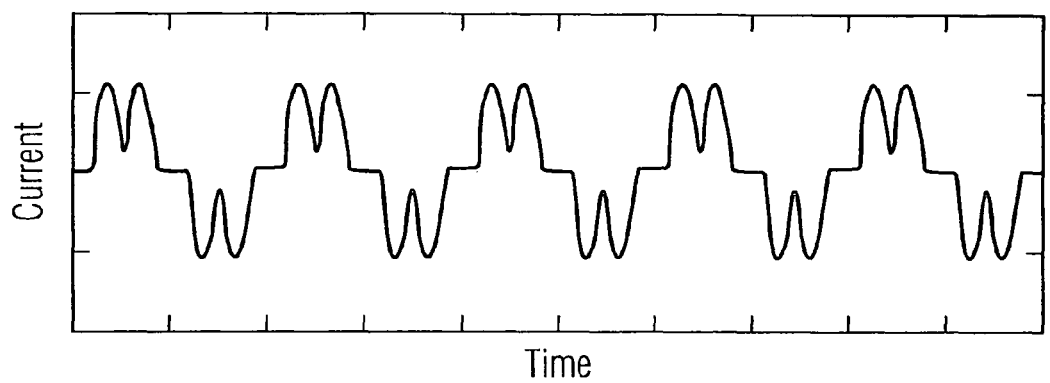
FIGS. 5A and 5B show respectively the waveforms of current and voltage under a rectifier load condition.
Figure 5B:
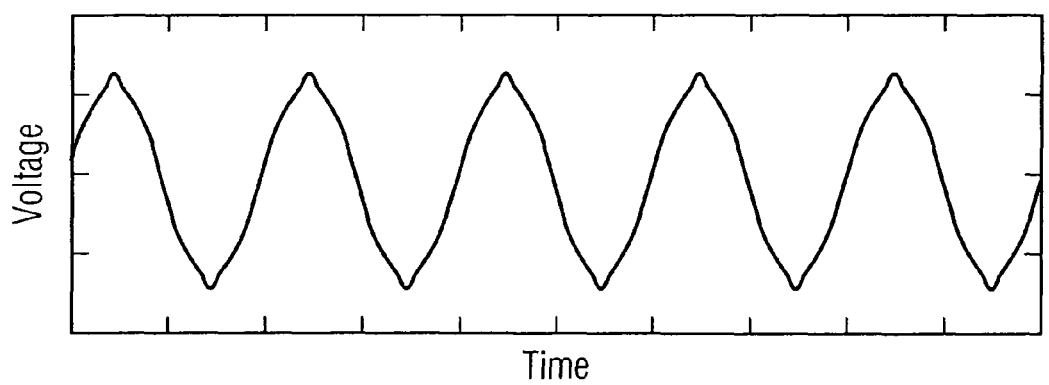

Under the conditions of a normal linear load, the above-explained point-to-point detecting method is quite effective. However, when a rectifier load having high harmonic currents is connected at the downstream of the PMD, as shown in FIG. 4, the situation will change. As shown in FIG. 4, $z_s$ represents the impedance of power supply between the rectifier load and the power supply, PMD is mounted at the upstream of the rectifier load to monitor its operating states. When the rectifier load is set to an operating state by closing a switch, a load current having high harmonic will appear in the system. Since the harmonic currents will also flow through the impedance of the power supply, this will cause voltage distortion in a common bus. The waveforms of typical harmonic currents and the voltage in the common bus are shown respectively in FIGS. 5A and 5B. Comparing the voltage waveform with the reference waveform, it is discovered that the harmonic components have already caused the distortion in the waveform.

Figure 6:
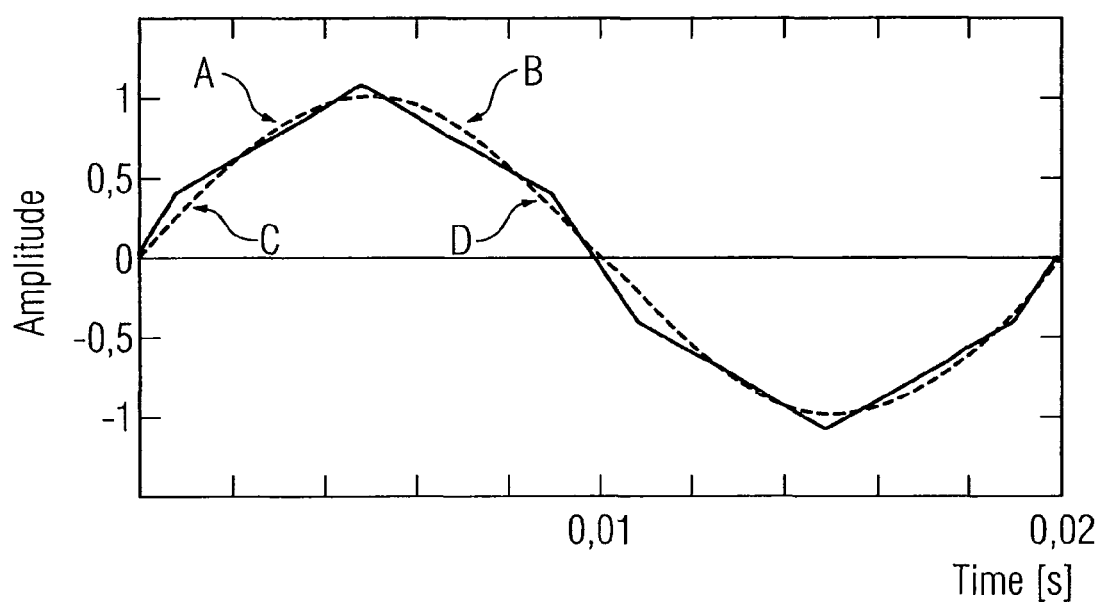
FIG. 6 shows a schematic view of the point-to-point detection in case of a distorted power supply waveform.

In this case, the method for detecting voltage disturbance needs to be adjusted correspondingly. Otherwise, as shown in FIG. 6, at the positive value portion of the waveform, since the actual sampled values are always less than their reference values, the regions A and B can be regarded as voltage temporary-drop, and for the same reason, the regions C and D can be regarded as voltage surge.

The method for detecting voltage disturbance can be adjusted correspondingly in the following two aspects:

a. in the above mentioned case, although there exists distortion in the voltage waveform of the power supply, it can still be regarded as the normal operating state of the system. Therefore, the best way to handle this is to update the reference table for storing the reference waveform to adapt it to the distortion in the voltage waveform of the power supply. The updating of the reference table can be carried out with very small step length to avoid any over-sensitive response. The reference table of very slow variation can filter the noises arisen by any data acquisition existed typically in A/D conversion.

Based on the above analysis, it is recommended to use the following reference table to do the updating, and the corresponding formula is:

$$R_{(m,n)} = R_{(m-1,n)} + [S_{(m,n)} - R_{(m-1,n)}] * K \quad (1)$$

wherein, R represents the digitized point values in the reference table, S represents the actual sampled values from the voltage the power supply, m represents the mth update of the reference table and m>=1, n represents the nth point and its range is [1, 128]. K can be called an "updating coefficient"; it determines the updating speed of the reference table. In general, K=0.1 is the best choice.

Then, more specific explanation of the formula (1) is given as following:

the updating of the reference table can be specified to start after the zero-crossing points (changes from negative value to positive value).

Assuming the original values in the reference table are R(0, 1), R(0, 2), . . . , R(0, 128), according to formula (1):

the updating of the reference table for the first time is:

$$R_{(1,1)} = R_{(0,1)} + (S_{(1,1)} - R_{(0,1)}) \times 0.1$$

$$R_{(1,2)} = R_{(0,2)} + (S_{(1,2)} - R_{(0,2)}) \times 0.1$$

$$\ldots$$

$$R_{(1,127)} = R_{(0,127)} + (S_{(1,127)} - R_{(0,127)}) \times 0.1$$

$$R_{(1,128)} = R_{(0,128)} + (S_{(1,128)} - R_{(0,128)}) \times 0.1$$

the updating of the reference table for the second time is:

$$R_{(2,1)} = R_{(1,1)} + (S_{(2,1)} - R_{(1,1)}) \times 0.1$$

$$R_{(2,2)} = R_{(1,2)} + (S_{(2,2)} - R_{(1,2)}) \times 0.1$$

$$\ldots$$

$$R_{(2,127)} = R_{(1,127)} + (S_{(2,127)} - R_{(1,127)}) \times 0.1$$

$$R_{(2,128)} = R_{(1,128)} + (S_{(2,128)} - R_{(1,128)}) \times 0.1$$

and the rest can be deduced in the same way.

In this embodiment, only those reference values corresponding to points with Difs greater than the predetermined threshold values (for example 5% of corresponding points in the reference waveform) are updated according to the updating algorithm.

If a voltage disturbance occurs during the period for updating the reference table, a preventive measure must be implemented: if the difference between a reference point value and an actual point value is greater than a predetermined disturbance threshold value, then the reference point value of this point is locked and it is switched to the voltage disturbance detection process. The disturbance threshold mentioned here can be for example 20% of corresponding point value in a current reference waveform, this value can also be adjusted according to practical situations.

If the differences between the reference values R(m, n) and the actual values S(m, n), n=1, 2, . . . , 128, are less than the predetermined threshold values (typically less than 5%), the updating of the reference table is stopped.

After the above mentioned update processing, the reference table will become closer to the waveform of input power supply, thereby distorted power supply voltage will not trigger waveform recording.

b. Then the problem to be solved is, under which conditions can the reference table be updated, or in other words, how to distinguish the distortion in power supply voltage and voltage disturbance?

Figure 7:
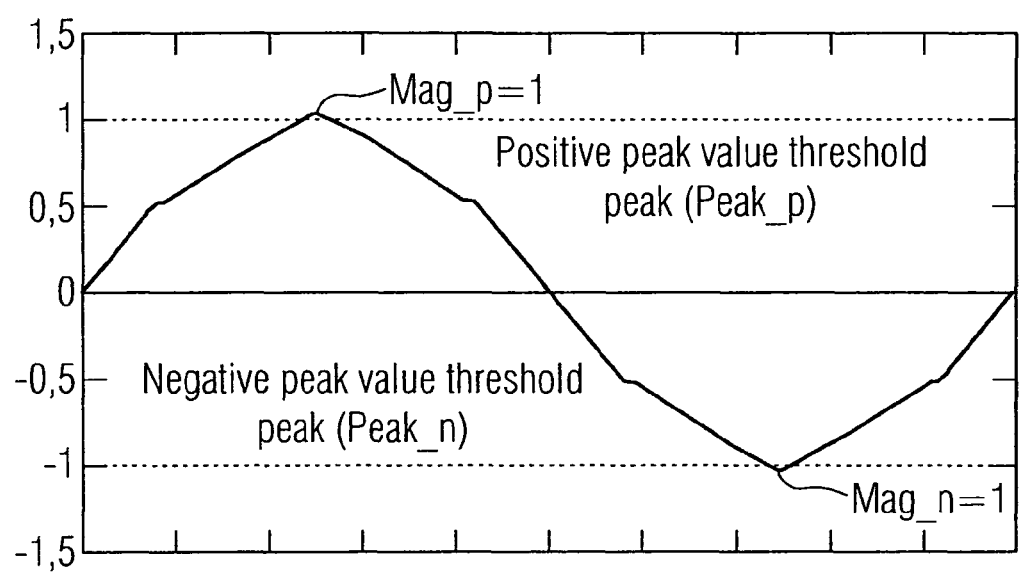
FIG. 7 shows the situation of peak value detection.

This problem can be solved by using the so-called "peak value detector", in which, two indicators called "Mag_p" and "Mag_n" will be used to indicate whether the positive and negative portions of a sine wave of the power supply voltage have already reached respectively a peak value threshold value. Under normal situations, these peak values can be the positive peak value and the negative peak value of the reference waveform, however, they can also be adjusted appropriately according to the actual situations of the site. Specifically, as shown in FIG. 7, if the positive peak value of the power supply voltage is greater than a positive peak value threshold, the "Mag_p" is set high (for example, set 1). If the negative peak value of the power supply voltage is less than a negative peak value threshold, the "Mag_n" is set high (for example, set 1). Only when both of these two indicators are set high within one voltage waveform cycle, the waveform of the power supply can be regarded as normal and the reference table can be allowed to update.

Figure 8:
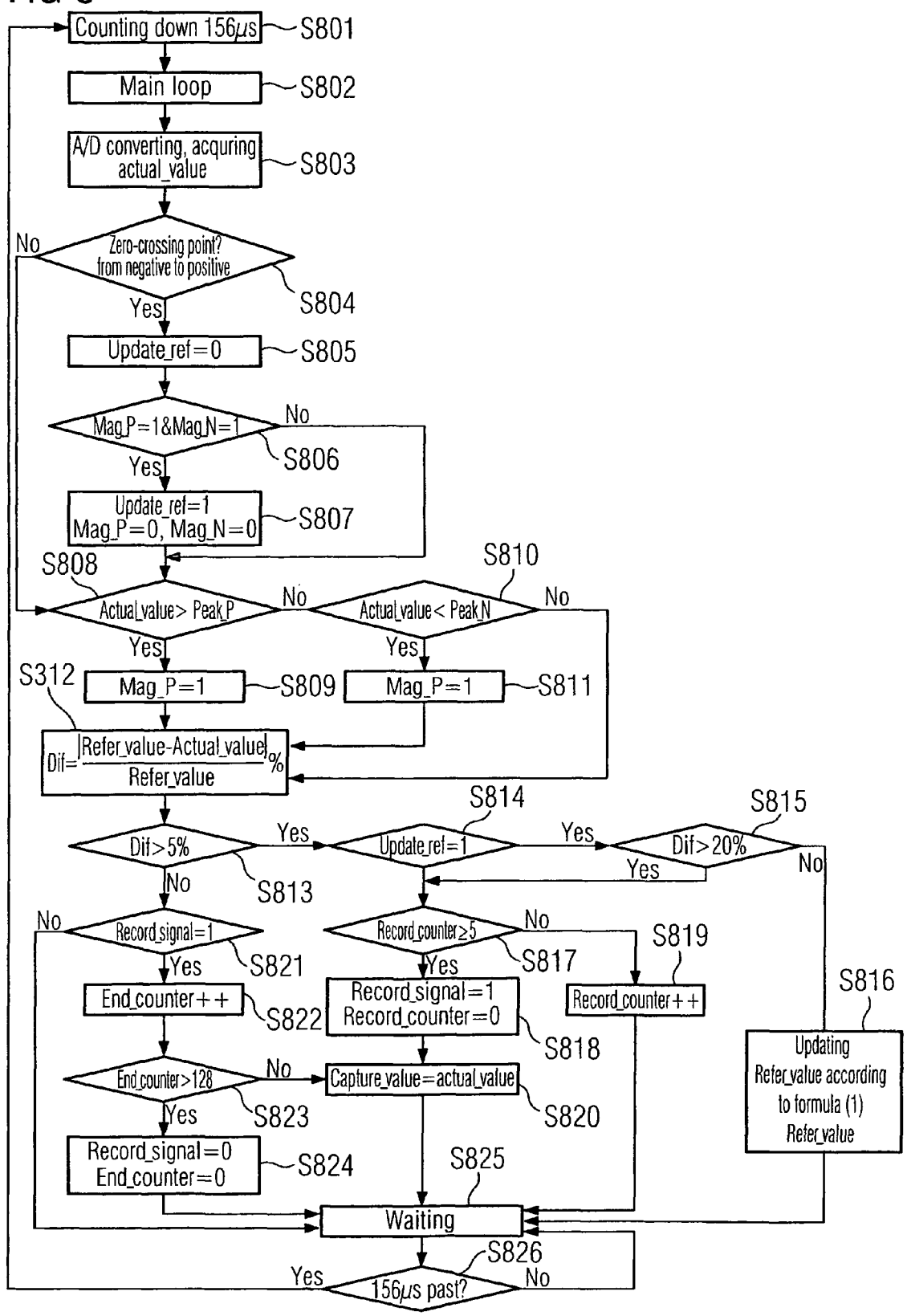
FIG. 8 shows a flow chart of the point-to-point voltage disturbance detection according to the second embodiment of the present invention.

According to the above description, a corresponding flowchart is shown in FIG. 8. In FIG. 8, reference indicators that are the same as in FIG. 3 have the same meaning. In FIG. 8, Updata_ref is an indicator for indicating whether the reference waveform is allow to update; Mag_p is used to indicate whether the actual voltage value is greater than a positive peak value threshold peak_p, likewise, Mag_n is used to indicate whether the actual voltage value is less than a negative peak value threshold peak_n.

Since the corresponding steps in FIG. 8 have already been described by reference to FIG. 3, the process in FIG. 8 for updating the reference table will be explained in detail below.

At step S801, the device for detecting voltage disturbance counts down a predetermined time interval, for example 156 μs, at step S802, the device for detecting voltage disturbance begins to enter a main loop, at step S803, the actual voltage values are acquired and A/D conversion is carried out in order to convert the actual voltage values into digitized point values actual_value, at step S804, the device for detecting voltage disturbance judges whether the point is a zero-crossing point from negative to positive, if it is judged as true, the device for detecting voltage disturbance sets Update_ref=0 at step S805.

At step S806 the device for detecting voltage disturbance judges whether the Mag_p and Mag_n are all 1, if not, the program progresses to step S808, so as to judge whether the actual voltage value actual_value>Peak_p, if not, it continues judging at step S810 whether the actual voltage value actual_value<peak_n, if it is still not, the device for detecting voltage disturbance progresses into step S812, in order to calculate the difference ratio Dif of corresponding point values in the reference waveform to the digitized actual voltage point values. After this, it is similar to the flow shown in FIG. 3, the device for detecting voltage disturbance carries out the voltage disturbance detection. The device for detecting voltage disturbance repeats continually the loop shown in FIG. 8, until at step S808 the device for detecting voltage disturbance judges that the acquired actual voltage is greater than a positive peak value threshold Peak_p, then the device for detecting voltage disturbance sets Mag_p=1 at step S809. And if in the subsequent loop the device for detecting voltage disturbance judges at step S810 that the acquired actual voltage value is less than a negative peak value threshold Peak_n, the device for detecting voltage disturbance sets Mag_n=1 at step S811. If and only if Mag_p and Mag_n are both set as 1, the device for detecting voltage disturbance sets Update_ref=1 at step S807 so as to allow the updating of the reference table and to reset Mag_p and Mag_n.

If the device for detecting voltage disturbance judges at step S813 that Dif is greater than 5% and judges at step S814 that Update_ref=1, the device for detecting voltage disturbance updates corresponding Refer_value according to formula (1) at step S816. Then the device for detecting voltage disturbance clears Mag_p and Mag_n to zero after having waited for the arrival of a 156 μs time interval and enters into the next loop. Otherwise, if the device for detecting voltage disturbance judges at step S814 that the Update_ref=0, and judges at step S817 that the Record_counter is greater than or equal to 5, i.e. the fact Dif>5% has already lasted for a time period of 5 points, the device for detecting voltage disturbance judges that a voltage disturbance occurred and sets Record_signal=1 at step S818 and resets Record_counter=0, so as to start recording actual voltage value at step S820, i.e. recording Capture_value=actual_value. If it is judged at step S817 that the lasting time of Record_counter is less than 5, i.e. Dif>5% has lasted for less than 5 points, step S819 is entered to increase Record_counter.

Preferably, if it is judged at step S814 that Update_ref=1, the device for detecting voltage disturbance will further judge at step S815 whether Dif is greater than 20%, if Dif is greater than 20% and has lasted for 5 points, it indicates that a disturbance exists in the actual voltage, then the device for detecting voltage disturbance will not enter into the step for updating the reference table, instead, it enters into step S817 to carry out the detecting and recording of the voltage disturbance. If Dif is less than or equal to 20%, then the device for detecting voltage disturbance updates a corresponding Refer_value according to formula (1) at step S816.

Figure 9:
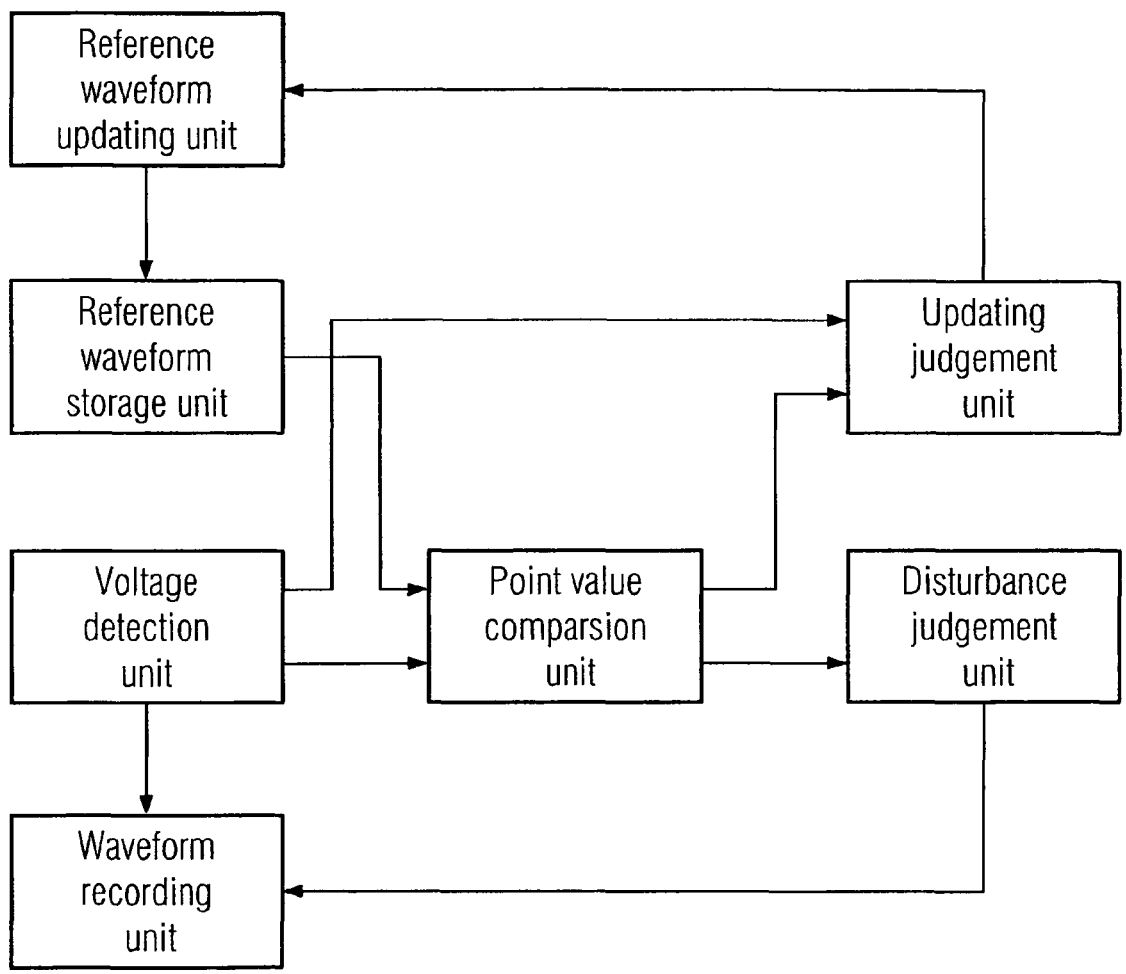
FIG. 9 shows a schematic view of the device for detecting voltage disturbance according to the embodiments of the present invention.

The device for detecting voltage disturbance capable of implementing aforesaid method of the present invention is shown in FIG. 9.

Specifically, the device for detecting voltage disturbance for implementing the method of the first embodiment of the present invention comprises: a reference waveform storage unit, a voltage detection unit, a point value comparison unit and a disturbance judgment unit. Wherein, the reference waveform storage unit is used for storing the digitized point values of a reference waveform; the voltage detection unit is used for detecting the actual voltage values, and converting the actual voltage values by digitization into the point values of the actual voltage which are in one-to-one correspondence with the point values of the reference waveform; the point value comparison unit is used for comparing the point values of the actual voltage obtained from the voltage detection unit with the corresponding point values of the reference waveform from the reference waveform storage unit; the disturbance judgment unit is used for obtaining the comparison results of the point value comparison unit, and judges that a voltage disturbance has occurred if, for N successive points, the differences between the point values of the actual voltage and the corresponding point values of the reference waveform are all greater than a predetermined disturbance threshold, wherein N is an integer greater than 0.

In order that the reference waveform is adapted to the distortion in the power supply voltage, the device for detecting voltage disturbance can further comprise an updating judgment unit and a reference waveform updating unit. Wherein, the updating judgment unit is used for comparing the positive and negative peak values of the actual voltage obtained from the voltage detection unit respectively with the predetermined positive and negative peak thresholds, and comparing the comparison results obtained from the point value comparison unit with a predetermined distortion threshold, so as to notify the reference waveform updating unit to update the point values of the reference waveform when the comparison results meet a reference waveform updating condition; the reference waveform updating unit is used for updating the point values of the reference waveform in the reference waveform storage unit according to an updating algorithm in case it has been notified to update by the updating judgment unit. The condition for updating reference waveform can be, for example, the updating condition set in the method described in the second embodiment of the present invention. Specific method for updating the point values of reference waveform can also refer to the second embodiment of the present invention.

When a voltage disturbance occurs, it can further trigger a recording signal to record the actual voltage waveform, for subsequent further analysis, and for this purpose, the device for detecting voltage disturbance of the present invention can further comprise a waveform recording unit for recording the point values of the actual voltage detected by the voltage detection unit when the disturbance judgment unit judges that a voltage disturbance has occurred. Or serving as an alternative solution, it can further comprise a circulating buffer memory (not shown in the figure), for successively storing the point values of the actual voltage detected by the voltage detection unit according to a first in first out (FIFO) rule, and locking the circulating buffer memory when the disturbance judgment unit judges that a voltage disturbance has occurred, so as to analyze the data prior to the occurrence of the disturbance.

In addition, a user can connect the on/off state signal of a rectifier load to the digital input port of a PMD, which port usually is located inside the PMD. This is very advantageous for the user to determine whether the voltage distortion/disturbance is caused by himself or by other sources.

The method proposed in at least one embodiment of the present invention is rather robust and is easy to implement in a PMD or other electric power detection equipment, and at the same time it is sensitive enough for users to capture any voltage disturbance under any load conditions. Therefore, this invention of at least one embodiment provides an effective method capable of being broadly used in PMDs and electric energy detection equipment.

Further, elements and/or features of different example embodiments may be combined with each other and/or substituted for each other within the scope of this disclosure and appended claims.

Still further, any one of the above-described and other example features of the present invention may be embodied in the form of an apparatus, method, system, computer program and computer program product. For example, of the aforementioned methods may be embodied in the form of a system or device, including, but not limited to, any of the structure for performing the methodology illustrated in the drawings.

Even further, any of the aforementioned methods may be embodied in the form of a program. The program may be stored on a computer readable media and is adapted to perform any one of the aforementioned methods when run on a computer device (a device including a processor). Thus, the storage medium or computer readable medium, is adapted to store information and is adapted to interact with a data processing facility or computer device to perform the method of any of the above mentioned embodiments.

The storage medium may be a built-in medium installed inside a computer device main body or a removable medium arranged so that it can be separated from the computer device main body. Examples of the built-in medium include, but are not limited to, rewriteable non-volatile memories, such as ROMs and flash memories, and hard disks. Examples of the removable medium include, but are not limited to, optical storage media such as CD-ROMs and DVDS; magneto-optical storage media, such as MOs; magnetism storage media, including but not limited to floppy disks (trademark), cassette tapes, and removable hard disks; media with a built-in rewriteable non-volatile memory, including but not limited to memory cards; and media with a built-in ROM, including but not limited to ROM cassettes; etc. Furthermore, various information regarding stored images, for example, property information, may be stored in any other form, or it may be provided in other ways.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A method for judging occurrence of voltage disturbance, comprising:
storing digitized point values of a voltage reference waveform on a reference waveform storage unit of a device configured to judge an occurrence of a voltage disturbance in electric power measurement equipment;
detecting actual voltage values and converting, in a voltage detection unit of the device, by digitization, actual voltage values into point values of the actual voltage which are in one-to-one correspondence with the stored digitized point values of the reference waveform;
comparing the point values, in a point value comparison unit of the device, of the actual voltage values with the corresponding point values of the reference waveform; and
judging occurrence of a voltage disturbance, in a disturbance judgment unit of the device, if, for N successive points, differences between said point values of the actual voltage and said point values of the reference waveform, obtained from the comparison, are all greater than a disturbance threshold, wherein N is an integer greater than 0, wherein, said reference waveform updating condition is that: the detected positive peak value of the actual voltage waveform is greater than a positive peak threshold and the negative peak value thereof is smaller than a negative peak threshold, and the differences between the values of the actual voltage and said corresponding point values of the reference waveform are greater than a distortion threshold.

2. The method for judging occurrence of a voltage disturbance as claimed in claim 1, wherein, said point values of the reference waveform are obtained by digitizing a standard voltage waveform successively at a fixed time interval.

3. The method for judging occurrence of a voltage disturbance as claimed in claim 2, wherein, said fixed time interval has a value range of 10 microseconds to 2000 microseconds.

4. The method for judging occurrence of a voltage disturbance as claimed in claim 1, wherein, said disturbance threshold is a product of said point values of the reference waveform and a percentage.

5. The method for judging occurrence of a voltage disturbance as claimed in claim 1; wherein N ranges from 3 to 5.

6. The method for judging occurrence of a voltage disturbance as claimed in claim 1, further comprising:
updating the point values of the voltage reference waveform according to an updating algorithm when it meets a reference waveform updating condition.

7. The method for judging occurrence of a voltage disturbance as claimed in claim 6, wherein, said updating algorithm is:

$$R_{(m,n)} = R_{(m-1,n)} + [S_{(m,n)} - R_{(m-1,n)}]/K \quad (1)$$

wherein, R represents the point value of the reference waveform, S represents the point value of the actual voltage, m represents the mth updating and m>=1, n represents the nth point, and K is an update coefficient for determining an updating speed.

8. The method for judging occurrence of a voltage disturbance as claimed in claim 1, further comprising:
when it is judged that a voltage disturbance occurs, starting to record the point values of the actual voltage until the voltage recovers to normal and continuing for a length of time.

9. The method for judging occurrence of a voltage disturbance as claimed in claim 8, wherein, said length of time is one cycle of the voltage waveform.

10. The method for judging occurrence of a voltage disturbance as claimed in claim 1, further comprising:
storing successively the point values of the actual voltage in a circulating buffer memory according to a first in first out (FIFO) rule, and locking the circulating buffer memory when it is judged that a voltage disturbance has occurred.

11. A non-transitory computer readable medium containing computer instructions stored therein for causing a computer processor to perform the method of claim 1.

12. A method for judging occurrence of voltage disturbance, comprising:
storing digitized point values of a voltage reference waveform on a reference waveform storage unit of a device configured to judge an occurrence of a voltage disturbance in electric power measurement equipment;
detecting actual voltage values and converting, in a voltage detection unit of the device, by digitization, actual voltage values into point values of the actual voltage which are in one-to-one correspondence with the stored digitized point values of the reference waveform;
comparing the point values, in a point value comparison unit of the device, of the actual voltage values with the corresponding point values of the reference waveform; and
judging occurrence of a voltage disturbance, in a disturbance judgment unit of the device, if, for N successive points, differences between said point values of the actual voltage and said point values of the reference waveform, obtained from the comparison, are all greater than a disturbance threshold, wherein N is an integer greater than 0, wherein, said reference waveform updating condition further comprises that: the differences between the values of the actual voltage and said corresponding point values of the reference waveform are less than or equal to a disturbance threshold.

13. A device for judging occurrence of a voltage disturbance, comprising:
a reference waveform storage unit, to store digitized point values of a reference waveform;
a voltage detection unit, to detect actual voltage values, and to convert by digitization the actual voltage values into point values of the actual voltage which are in one-to-one correspondence with the stored digitized point values of the reference waveform;
a point value comparison unit, to compare the point values of the actual voltage obtained from said voltage detection unit with the corresponding point values of the reference waveform obtained from said reference waveform storage unit; and
a disturbance judgment unit, to obtain comparison results of the point value comparison unit, and to judge occurrence of a voltage disturbance, for N successive points, a differences between the point values of the actual voltage and said corresponding point values of the reference waveform, obtained from the comparison, are all greater than a disturbance threshold, wherein N is an integer greater than 0;
an updating judgment unit, to compare respectively positive and negative peak values of the actual voltage obtained from said voltage detection unit with positive and negative peak value thresholds, comparing comparison results obtained from the point value comparison unit with a distortion threshold, and notifying a reference waveform updating unit to update the point values of the reference waveform when the comparison results meet a reference waveform updating condition; and
the reference waveform updating unit, to update the point values of the reference waveform in the reference waveform storage unit according to an updating algorithm in case that it has been notified to update by the updating judgment unit.

14. The device for judging occurrence of a voltage disturbance as claimed in claim 13, further comprising:
a waveform recording unit, to record the point values of the actual voltage detected by said voltage detection unit when said disturbance judgment unit judges that a voltage disturbance has occurred.

15. The device for judging occurrence of a voltage disturbance as claimed in claim 14, further comprising:
a circulating buffer memory, to successively store the point values of the actual voltage detected by said voltage detection unit according to a first in first out (FIFO) rule, and locking said circulating buffer memory when said disturbance judgment unit judges that a voltage disturbance has occurred.

16. A device for judging occurrence of a voltage disturbance, comprising:
- means for storing digitized point values of a voltage reference waveform;
- means for detecting actual voltage values and converting, by digitization, the actual voltage values into point values of the actual voltage which are in one-to-one correspondence with the stored digitized point values of the reference waveform;
- means for comparing the point values of the actual voltage values with the corresponding point values of the reference waveform; and
- means for judging occurrence of a voltage disturbance if, for N successive points, differences between said point values of the actual voltage and said point values of the reference waveform, obtained from the comparison, are all greater than a disturbance threshold, wherein N is an integer greater than 0;
- means for comparing respectively positive and negative peak values of the actual voltage obtained from said means for detecting actual voltage values with positive and negative peak value thresholds; and
- means for comparing comparison results obtained from the means for comparing point values with a distortion threshold, and notifying a reference waveform updating unit to update the point values of the reference waveform when the comparison results meet a reference waveform updating condition, wherein
- the means for storing digitized point values updates the point values of the reference waveform in the reference waveform storage unit according to an updating algorithm in case that it has been notified to update by the updating judgment unit.

* * * * *